United States Patent
Friedrich et al.

(10) Patent No.: US 6,770,837 B2
(45) Date of Patent: Aug. 3, 2004

(54) METHOD FOR CONNECTING A PRINTED CIRCUIT TO A LIQUID CRYSTAL DISPLAY

(75) Inventors: Durand Friedrich, Solothurn (CH); Pfefferli Beat, Thielle-Wavre (CH)

(73) Assignee: Eta Sa Manufacture Horlogère Suisse, Grenchen (CH)

( * ) Notice: Subject to any disclaimer, the term of this patent is extended or adjusted under 35 U.S.C. 154(b) by 0 days.

(21) Appl. No.: 10/403,035

(22) Filed: Apr. 1, 2003

(65) Prior Publication Data

US 2003/0197827 A1 Oct. 23, 2003

(30) Foreign Application Priority Data

Apr. 19, 2002 (EP) .............................................. 02076554

(51) Int. Cl.[7] .............................................. B23K 26/00
(52) U.S. Cl. .............................. 219/121.6; 219/121.66; 219/121.64
(58) Field of Search ........................ 219/121.6, 121.63, 219/121.64, 121.65, 121.66, 121.85; 349/187, 1

(56) References Cited

U.S. PATENT DOCUMENTS

| 4,654,965 A | | 4/1987 | Uehara et al. |
|---|---|---|---|
| 4,836,651 A | * | 6/1989 | Anderson .................... 349/150 |
| 4,975,145 A | * | 12/1990 | Yamazaki et al. ............ 216/23 |
| 5,102,361 A | * | 4/1992 | Katayama et al. ............. 445/4 |
| 5,528,403 A | * | 6/1996 | Kawaguchi et al. ........ 349/149 |
| 5,600,460 A | * | 2/1997 | Yamamoto et al. ........... 349/54 |
| 5,606,440 A | * | 2/1997 | Kawaguchi et al. ........ 349/188 |
| 6,639,634 B1 | * | 10/2003 | Zhang et al. ................. 349/54 |
| 2001/0028418 A1 | * | 10/2001 | Ozaki et al. .................. 349/54 |
| 2003/0016326 A1 | * | 1/2003 | Hashimoto .................. 349/139 |

* cited by examiner

*Primary Examiner*—M. Alexandra Elve
(74) *Attorney, Agent, or Firm*—Sughrue Mion, PLLC

(57) ABSTRACT

Method for connecting a printed circuit board (PCB) to the paths of the electrodes of a liquid crystal display cell (LCD) comprising, in a known manner, an upper plate, a lower plate and a sealing frame for confining said liquid crystals. The method consists of the following steps:

- constructing the display cell while providing at least one extension of small width of the upper plate to support the electrode paths on its lower surface;
- creating a connection zone by positioning said extension on contacts facing the PCB, and
- focussing a laser beam on the connection zone, through the upper plate or in grazing incidence with respect to the lower plate to definitively establish the connections between the paths and the contacts of the PCB.

4 Claims, 1 Drawing Sheet

METHOD FOR CONNECTING A PRINTED CIRCUIT TO A LIQUID CRYSTAL DISPLAY

BACKGROUND OF THE INVENTION

The present invention concerns a method for connecting a liquid crystal display to a printed circuit, particularly the printed circuit carrying the electronic components of a digital display, in a timepiece.

A liquid crystal display (LCD) includes, in a known manner, outside the sealing frame of two transparent substrates of the same dimension, paths for connecting the electrodes of the display to a printed circuit board (PCB) that, to the best of the Applicant's knowledge, always has a substantially plane surface. This connection is currently achieved by means of a multipath connector of the "Zebra" type by soldering, or by using an anisotropic conductive adhesive, or an anisotropic contacting foil (ACF). Such methods are technically entirely satisfactory when the LCD and the PCB are in the same plane. They are also satisfactory when, by choice or by necessity, the PCB is placed underneath the LCD, with, however, the risk of damaging the Zebra type connector paths if said connector is given too small a radius of curvature, as could be the case in a wristwatch with digital display having a case of very small thickness. In addition to the aforementioned risk, these methods also have the drawback of consuming relatively expensive intermediate materials (Zebra, ACF, etc.) and requiring a relatively long manufacturing time.

SUMMARY OF THE INVENTION

The present invention thus concerns a new method for connecting a LCD to a PCB, which is quicker, more economical and technically more reliable in that it does not rely on intermediate materials, but uses a laser beam.

The invention therefore concerns a method for connecting a printed circuit board (PCB) to the paths of the electrodes of a liquid crystal display cell (LCD) comprising, in a known manner, an upper plate, a lower plate and a sealing frame for confining said liquid crystal. The method comprises the following steps:

constructing the display cell while providing at least one extension of small width of the upper plate to support the electrode paths on its lower surface;

creating a connection zone by positioning said extension on contacts facing the PCB, and focussing a laser beam on the connection zone, through the upper plate or in grazing incidence with respect to the lower plate to definitively establish the connections between the paths and the contacts of the PCB.

The method according to the invention thus no longer uses any intermediate materials and allows the connection operation to be achieved in a shorter time, which contributes to reducing the cost price of the final product.

According to a first embodiment, the upper plate of the LCD can include only a single extension and the PCB can be connected in the extension of the LCD and substantially in the same plane.

According to a second embodiment, the upper plate of the LCD can include at least two extensions and the PCB can be located under the LCD. In this case, the PCB advantageously has a recess for housing the lower plate such that the edges of the recess are flush with the lower surface of the upper plate. The product thereby obtained is compact and has good mechanical properties.

BRIEF DESCRIPTION OF THE DRAWINGS

Other advantages and features of the present invention will appear more clearly upon reading the following description, made with reference to the annexed drawings, in which.

DETAILED DESCRIPTION OF THE INVENTION

Figure 1:
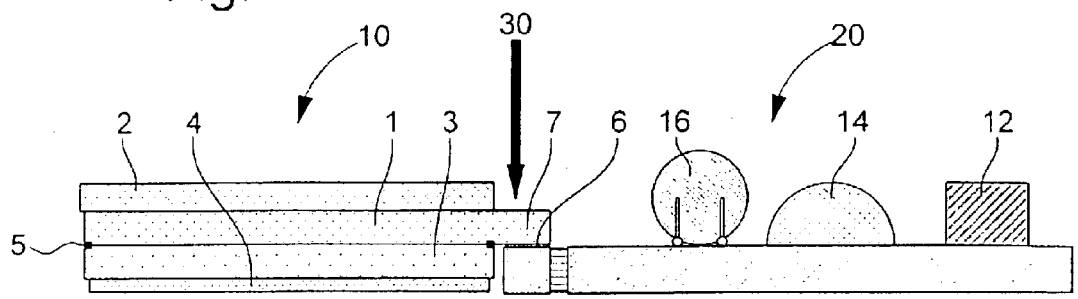
FIG. 1 shows a first embodiment in cross-section.

FIG. 1 shows schematically in cross-section a liquid crystal display cell (LCD) connected according to the method of the invention to a printed Circuit board 20 (PCB) able to be made of a flexible material. The cell includes in the usual manner a upper plate 1 at the front of which is placed a polariser 2, a lower plate 3, at the back of which is placed a reflector 4, and a sealing frame 5 delimiting the space confining the liquid crystals (not visible in FIG. 1 in which the thickness proportions have been substantially respected). It can be seen that upper plate 1 has an extension 7 supporting the electrode paths on its lower surface. A printed circuit board 20, supporting electronic components such as a capacitor 12, a chip 14 and a quartz 16, is positioned under said extension 7 placing the contact zones of the PCB opposite the paths to create a connection zone 6. A laser beam 30 is then applied to or focused on connection zone 6 through extension 7 of plate 1 to establish the definitive connection.

Figure 2:
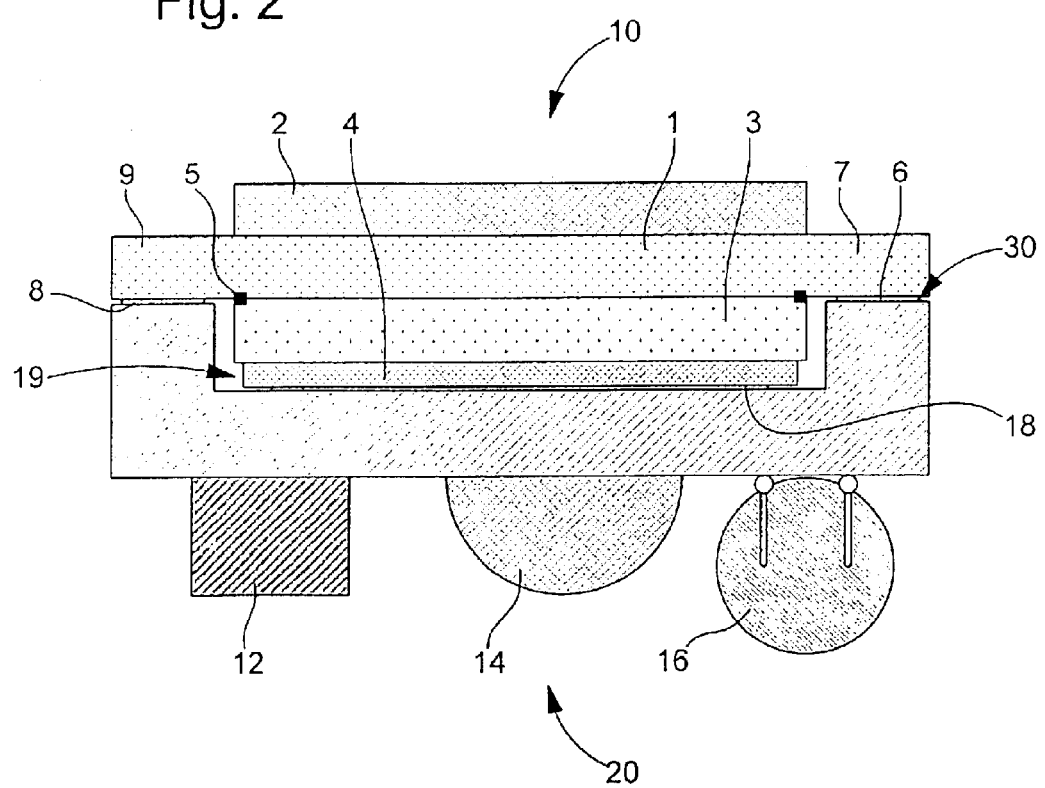
FIG. 2 shows a second embodiment in cross-section.

FIG. 2 concerns a second embodiment wherein the PCB is positioned under the LCD. LCD display cell 10 is comparable to that described in FIG. 1, but upper plate 1 includes two extensions 7 and 9 which will allow two connection zones to be established with the subjacent PCB 20. It can also be seen that PCB 20 includes a recess 19, which allows lower plate 3 and reflector 4 to be housed, such that the edges of the recess are flush with the lower surfaces of extensions 7, 9 supporting the electrode paths. Advantageously, the bottom of recess 19 is provided with an adhesive 18 allowing pre-assembly to be carried out, without for example relying on an assembly die. With this construction it is possible to focus laser beam 30 in grazing incidence on connection zones 6, 8.

For the examples that have just been described, with the dimensions of a display cell in an analogue display watch, experiments have shown that the time necessary to form the connection can be brought down from 10–12 seconds to 1–3 seconds, which constitutes a non-negligible economical advantage.

It will also be observed that the second embodiment allows the method according to the invention to be applied to a display comprising several superposed cells simply by staggering the connection zones in steps.

The present invention is not limited to the examples that have just been described and those skilled in the art can find other applications without departing from the scope of the present invention.

What is claimed is:

1. A method for connecting a printed circuit board to the paths of the electrodes of a liquid crystal display cell comprising a lower plate, an upper plate and a sealing frame for confining said liquid crystal, the following steps:

constructing the display cell while providing at least one extension of small width of the upper plate to support the electrode paths on its lower surface;

creating a connection zone by positioning said extension on contacts facing the PCB, and focusing a laser beam on the connection zone, through the upper plate or in grazing incidence with respect to the lower plate, to definitively establish the connections between the paths and the contacts of the PCB, wherein the upper plate of the LCD includes a single extension, and the PCB is located substantially in the same plane as the LCD.

2. A method for connecting a printed circuit board to the paths of the electrodes of a liquid crystal display cell comprising a lower plate, an upper plate and a sealing frame for confining said liquid crystal, comprising the following steps:

constructing the display cell while providing at least one extension of small width of the upper plate to support the electrode paths on its lower surface;

creating a connection zone by positioning said extension on contacts facing the PCB, and focusing a laser beam on the connection zone, through the upper plate or in grazing incidence with respect to the lower plate, to definitively establish the connections between the paths and the contacts of the PCB, wherein the upper plate of the LCD includes at least two extensions, and the PCB is located under the LCD.

3. The method according to claim 2, wherein the lower plate of the LCD is housed in a recess made in the PCB, the edges of said recess being flush with the lower surface of the upper plate of the LCD.

4. The method according to claim 1, wherein the PCB is made of a flexible material.

* * * * *